United States Patent [19]

Okumura

[11] Patent Number: 4,983,934
[45] Date of Patent: Jan. 8, 1991

[54] NOISE FILTER

[75] Inventor: Mitsunao Okumura, Nagaokakyo, Japan

[73] Assignee: Murata Manufacturing Co., Ltd., Japan

[21] Appl. No.: 340,272

[22] Filed: Apr. 19, 1989

[30] Foreign Application Priority Data

Apr. 20, 1988 [JP] Japan ................................. 63-98532
Oct. 3, 1988 [JP] Japan ................................. 63-24959

[51] Int. Cl.⁵ .......................... H03H 7/01; H03H 7/09
[52] U.S. Cl. ................................... 333/184; 333/181; 333/185; 361/303; 361/313
[58] Field of Search ................. 333/12, 167, 181, 184, 333/185, 177; 361/313, 303, 306, 328–330; 29/25.42

[56] References Cited

U.S. PATENT DOCUMENTS

| | | | |
|---|---|---|---|
| 1,298,396 | 3/1919 | Pruessman | 361/328 |
| 2,016,303 | 10/1935 | Sprague | 333/184 |
| 3,093,775 | 6/1963 | Lamphier | 361/330 |
| 3,483,453 | 12/1969 | Meyers | 361/330 |
| 4,048,593 | 9/1977 | Zillman | 361/313 X |
| 4,586,112 | 4/1986 | MacDougall | 361/330 |
| 4,945,322 | 7/1990 | Okumura | 333/181 X |

FOREIGN PATENT DOCUMENTS 0096910 5/1985 Japan ................................. 333/181

Primary Examiner—Eugene R. LaRoche
Assistant Examiner—Seung Ham
Attorney, Agent, or Firm—Ostrolenk, Faber, Gerb & Soffen

[57] ABSTRACT

A noise filter including a wound unit which is composed of two film sheets one of which is laid on the other. On one film sheet, two first conductors are formed, and a second conductor is formed on the other film sheet. Four terminals are fixed to the first conductors in such a manner that one pair of the terminals are fixed to one of the first conductors and the other pair of terminals are fixed to the other first conductors. By laying one of the film sheets on the other film sheet and winding the same together with the first and second conductors, each of the first conductors opposes the second conductor, whereby distributed capacitance (C1) is formed between each of the first conductors and the second conductor. The capacitance is connected in series between the first conductors via the second conductor. Cores are inserted in a hollow portion of the wound unit, whereby inductances (L1, L2) are formed by the first conductors, respectively.

2 Claims, 7 Drawing Sheets

NOISE FILTER

BACKGROUND OF THE INVENTION

1. Field of the Invention

The present invention relates to a noise filter More specifically, the present invention relates to a noise filter such as a line filter wherein inductances are respectively connected between input and output terminals and capacitance is connected between terminals at an input side and terminals at an output side.

2. Description of the Prior Art

Conventionally, such a kind of line filter or noise filter is manufactured by mounting a plurality of discrete parts such as capacitors, inductors etc. as shown in an equivalent circuit diagram of FIG. 15.

Therefore, in manufacturing the conventional noise filter, it takes a long time to mount the discrete parts, and therefore, the productivity thereof is low, and the amount that the cost can be reduced is limited. In addition, since the conventional noise filter is manufactured by mounting discrete parts, it is impossible to miniaturize the same.

SUMMARY OF THE INVENTION

Therefore, a principal object of the present invention is to provide a novel noise filter.

Another object of the present invention a compact and inexpensive noise filter.

A noise filter in accordance with the present invention comprises: a first longitudinal insulation sheet; a plurality of first conductors formed on one main surface of the first insulation sheet to be extended in a longitudinal direction of the first insulation sheet and insulated from each other; a plurality of first terminals including two pairs of terminals fixed on the first conductors in a manner that respective pairs of the first terminals are fixed to different first conductors, respective ends of which being exposed in a width direction of the first insulation sheet; a second longitudinal insulation sheet laid on the first insulation sheet; and a second conductor formed on one main surface of the second insulation sheet to be extended in a longitudinal direction of the second insulation sheet; wherein the first and second insulation sheets are wound together with the first and second conductors so as to form a wound unit, and the first terminals are exposed at an end surface of the wound unit.

Inductance is formed by at least a respective one of the plurality of first paired conductors between the first terminals. Since the first and second insulation sheets are wound in a state where the second insulation sheet is laid on the first insulation sheet, the first and second insulation sheets are sandwiched by the first conductors formed on the first insulation sheet and the second conductor formed on the second insulation sheet. Therefore, distributed capacitance is formed between each of the first conductors and the second conductor in such a manner that the distributed capacitance is connected via the second conductor between the respective first conductors. Therefore, if respective ones of the paired first terminals are used as input terminals and the other of the first paired terminals are used as output terminals, a line filter can be constructed.

In accordance with the present invention, since a noise filter is obtainable by merely winding the first and second insulation sheets together with the respective conductors, it is not necessary to mount a plurality of discrete parts such as capacitors, inductors etc. as was done in the past. Therefore, the productivity of manufacturing the noise filter can be increased, and thus, it is possible to reduce its cost.

In addition, by changing the positions where the first terminals are fixed on the first conductors, it is possible to make modifications by which only a value of the inductance can be changed, and therefore, a high performance noise filter can be obtained.

In another embodiment, the second conductor is divided into three second conductor pieces, and two second terminals are fixed to the second conductor pieces which sandwich the remaining one, which is connected to ground. In this embodiment, further capacitance is formed between each of the first terminals and the second terminals, that is, between each of the first terminals and ground.

The objects and other objects, features, aspects and advantages of the present invention will become more apparent from the following detailed description of the embodiments of the present invention when taken in conjunction with accompanying drawings.

DETAILED DESCRIPTION OF THE PREFERRED EMBODIMENTS

Figure 1:
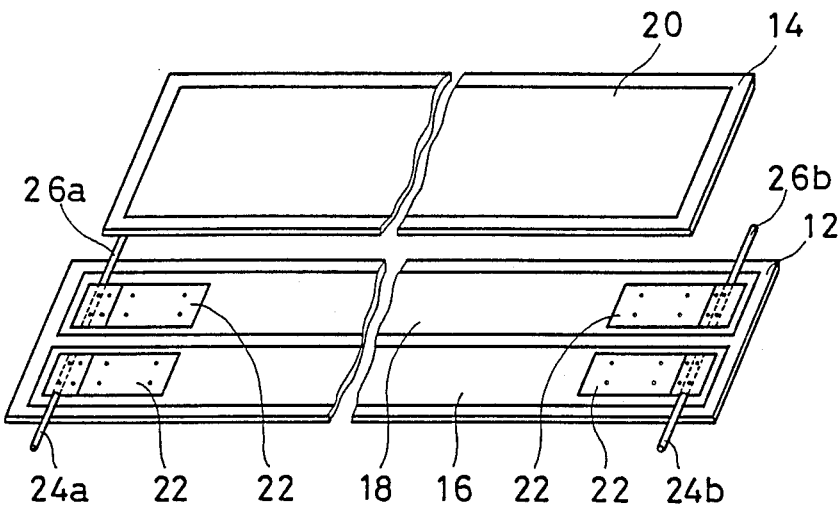
FIG. 1 is a perspective view showing unwound film sheets which are used to construct of one embodiment of a filter in accordance with the present invention.

With reference to FIG. 1, longitudinal film sheets 12 and 14 each of which is made of an insulation material such as polyester film are prepared. On upper surfaces of the film sheets 12, foil or leaf conductors 16 and 18 are adhered. Each comprises foil or leaf material made of a metal having good electrical conductivity such as aluminum or copper and may be called simply a "conductor" hereinafter. The conductors are adhered in such a manner that the conductors 16 and 18 are continuously extended in a longitudinal direction of the film sheet 12 and insulated from each other. A foil or leaf conductor 20 which is made of the same or similar material as that of the conductors 16 and 18 is adhered on the film sheet 14.

Terminals 24a and 24b and 26a and 26b are fixed on the conductors 16 and 18 at both ends thereof, respectively. These terminals are provided by fixing further foil or leaf conductors 22, each of which is made of a metallic foil or leaf material and may be called hereinafter a "conductor", onto the conductors 16 and 18 by means of spot welding. More specifically, each of the terminals 24a-26b is sandwiched by an end portion of a respective one of the conductors 22. That is, where an end portion of each conductor 22, having a rectangular shape, is folded-back over the terminal and welded by spot welding, whereby, each of the terminals 24a-26b is integrated with one of the conductors 22. Therefore, by fixing the conductors 22 onto the conductors 16 and 18 by means of spot welding, the terminals 24a and 24b and the terminals 26a and 26b can be respectively fixed to the conductors 16 and 18 and securely electrically connected thereto.

In FIG. 1, a black spot is illustrated at each portion of the conductors 22 where the spot welding is performed. Furthermore, it is desirable to flatten a portion of each of the respective terminals 24a-26b on which the spot welding is to be performed.

Figure 2:
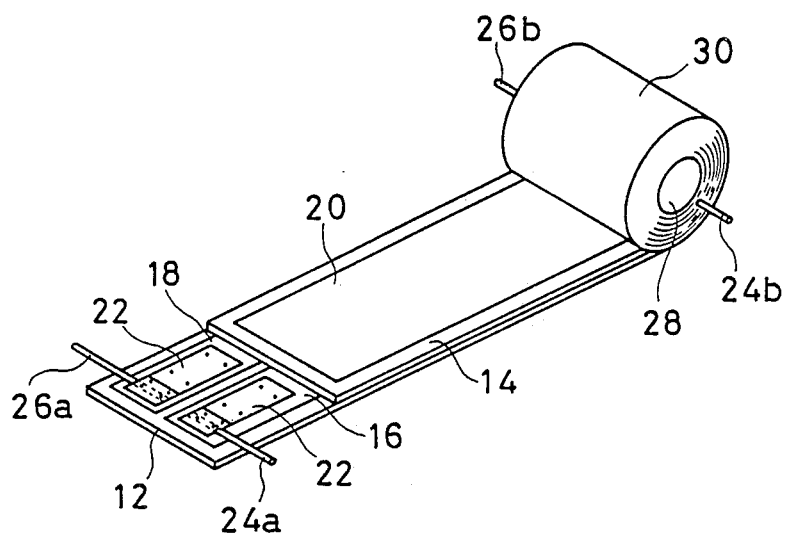
FIG. 2 is an illustrative view showing state film sheets shown in FIG. 1 being wound.

After completion of fixing the four terminals 24a-26b as shown in FIG. 1, the film sheet 14 is laid on the film sheet 12, and thereafter, as shown in FIG. 2, the film sheets 12 and 14 are wound together with the respective conductors 16, 18 and 20 so as to form a wound unit or cylindrical unit 30 having a center hole 28 in a manner that the film sheet 14 is within the film sheet 12.

Figure 3A:
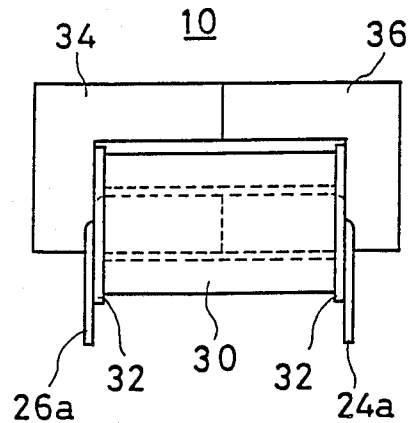
FIG. 3(A) and FIG. 3(B) are a front view and a side view showing U-cores being inserted in a cylindrical unit or wound unit formed as shown in FIG. 2.
Figure 3B:
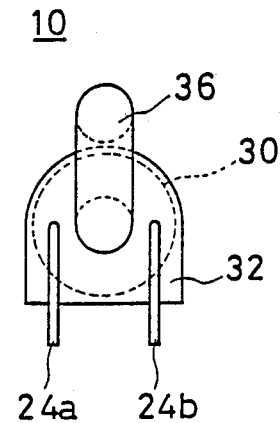

As shown in FIG. 3, reinforcing plates 32 each having semicircular shape are fixed on both end surfaces of the wound unit 30 which is formed as shown in FIG. 2. A throughhole is formed in each of the reinforcing plates 32, and U-cores 34 and 36 are inserted through each of the throughholes of the reinforcing plates 32 into the hollow portion or hole 28 of the wound unit or cylindrical unit 30 from both ends of the wound unit 30. Thereafter, the terminals 24a-26b are bent downward to be close to the reinforcing plates 32 as shown in FIG. 3.

The cores 34 and 36 are made of a material having high magnetic permeability such as ferrite and constitute a magnetic circuit in association with the conductors 16 and 18 so as to increase an inductance value to be described later.

Figure 4:
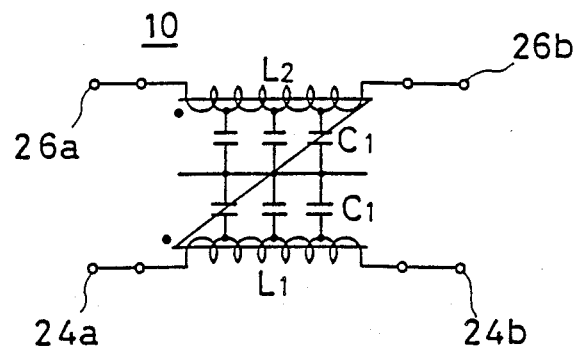
FIG. 4 is an equivalent circuit diagram of a noise filter obtained through the steps shown in FIG. 1–FIG. 3.

An equivalent circuit of the noise filter 10 thus obtained is shown in FIG. 4. More specifically, inductance L1 is formed between the terminals 24a and 24b by the conductor 16 on the film sheet 12 and the cores 34 and 36, and inductance L2 is formed between the terminals 26a and 26b by the conductor 18 on the film sheet 12 and the cores 34 and 36. In addition, distributed capacitances C1 are formed between each of the conductors 16 and 18 and the conductor 20 in such a manner that the distributed capacitances C1 are connected in series to each other between the respective first conductors 16 and 18 via the conductor 20.

Values of the inductance L1 and L2 can be determined by length and width of the conductors 16 and 18, and the size and the magnetic permeability of the cores 34 and 36. A value of the capacitance C1 can be determined by an area where each of the conductors 16 and 18 opposes the conductor 20 and the size and the dielectric constant of the film sheets 12 and 14.

Figure 5A:
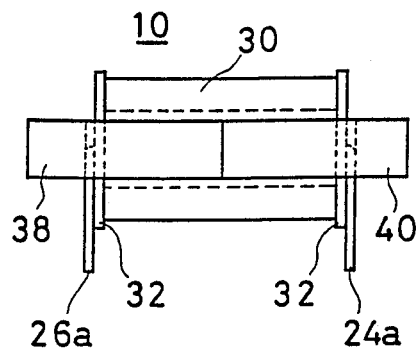
FIG. 5(A) and FIG. 5(B) are a front view and a side view showing E-cores being inserted in a cylindrical unit or wound unit formed as shown in FIG. 2.
Figure 5B:
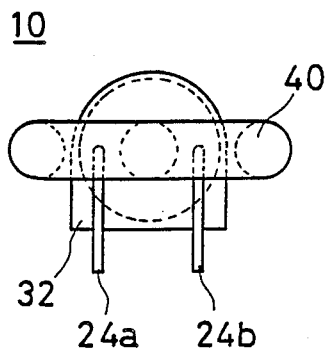

The cores are not necessarily U-cores 34 and 36 as shown in FIG. 3, but also may be E-cores 38 and 40 as shown in FIG. 5. If such E-cores 38 and 40 are inserted, since their magnetic resistance is smaller than that of the U-cores, it is possible to provide large values of the inductance L1 and L2 of the noise filter 10.

Figure 6:
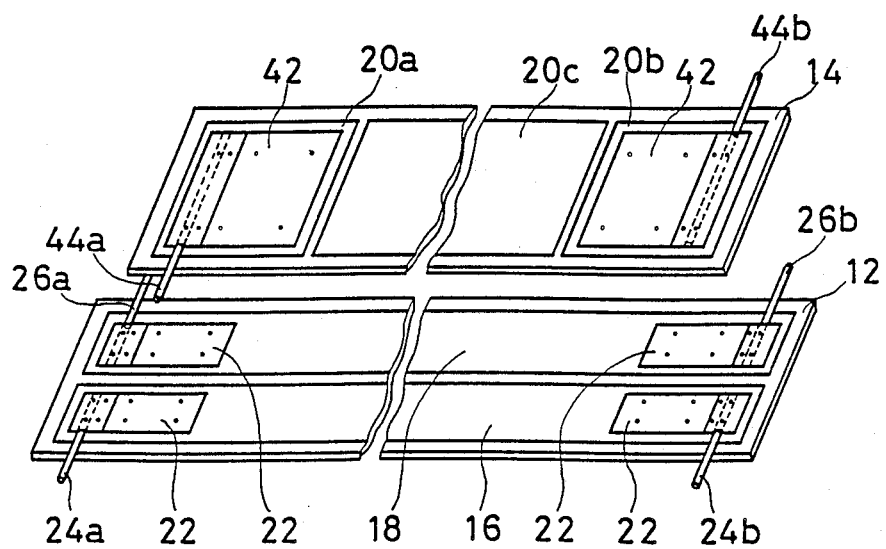
FIGS. 6, 7, 8(a), 8(b), 9(a) and 9(b) are illustrative views showing another embodiment of a filter in accordance with the present invention.
Figure 7:
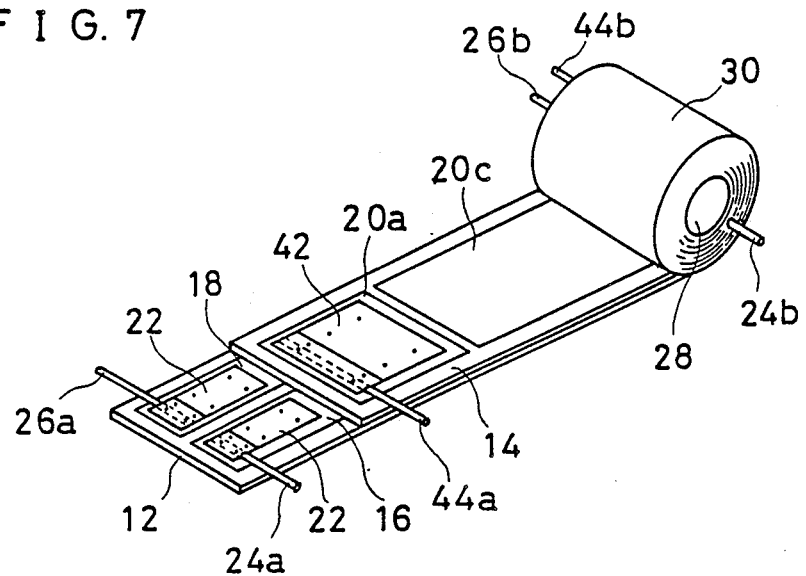

FIG. 6–FIG. 10 are illustrative views showing another embodiment in accordance with the present invention. In the this embodiment, capacitance C2 which is separated from the capacitance C1 is further formed. To this end, in this embodiment, as shown in FIG. 6, the conductor 20 on the film sheet 14 is divided into three conductor pieces 20a-20c which are separated or insulated from each other in a longitudinal direction of the film sheet 14. On the conductor pieces 20a and 20b, terminals 44a and 44b are fixed, respectively. Then, as shown in FIG. 7, the film sheets 12 and 14 are wound so as to form the cylindrical unit 30 as in the previous embodiment.

Figure 8A:
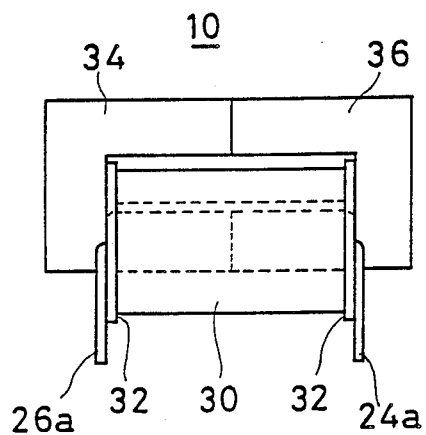
Figure 8B:
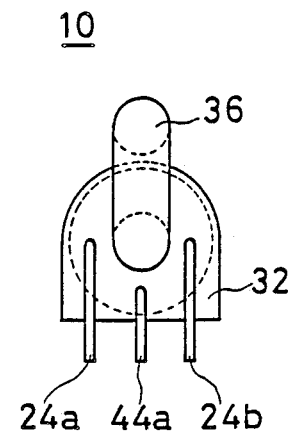
Figure 9A:
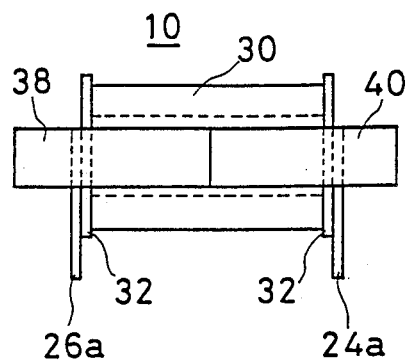
Figure 9B:
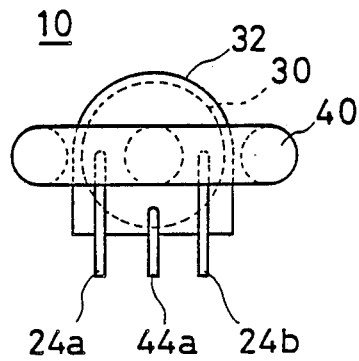

After that the reinforcing plates 32 are fixed as before. Then, by inserting the U-cores 34 and 36 in the cylindrical unit 30, a noise filter as shown in FIG. 8 is obtained. If the E-cores 38 and 40 are inserted, a noise filter 10 as shown in FIG. 9 is obtained.

Figure 10:
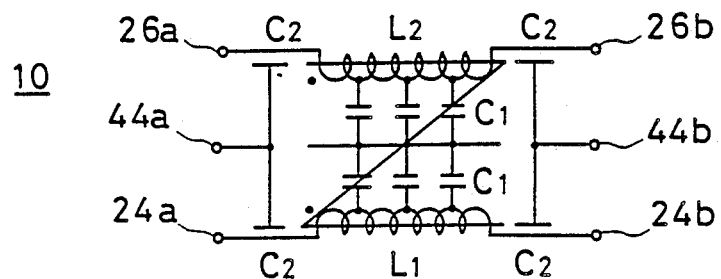
FIG. 10 is an equivalent circuit diagram of a noise filter obtained through the steps shown in FIG. 6–FIG. 9.
Figure 15:
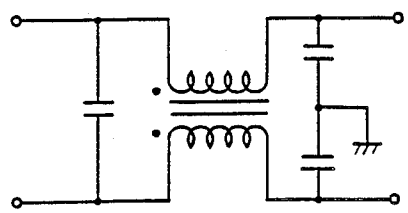
FIG. 15 is an equivalent circuit diagram showing one example of a conventional noise filter which is in the background of the present invention.

An equivalent circuit diagram of the noise filter thus completed is shown in FIG. 10. As seen from FIG. 10, a capacitance C2 is formed in association with each of the terminals 24a-26b. The noise filter 10 of this embodiment is used by connecting the terminals 44a and 44b to ground.

In the embodiment shown in FIG. 6–FIG. 10, in order to make the residual inductance small, the terminals 44a and 44b are arranged such that each of the terminals 44a and 44b is positioned halfway or in the vicinity thereof between the terminals 24a and 24b or between the terminals 26a and 26b. If the terminals 44a and 44b are arranged in such a manner, since the distances between each of the terminals 44a and 44b and the terminals 24a-26b become equal to each other, the residual inductance can be reduced. Therefore, a frequency characteristic of the capacitance C2 is improved.

Figure 11:
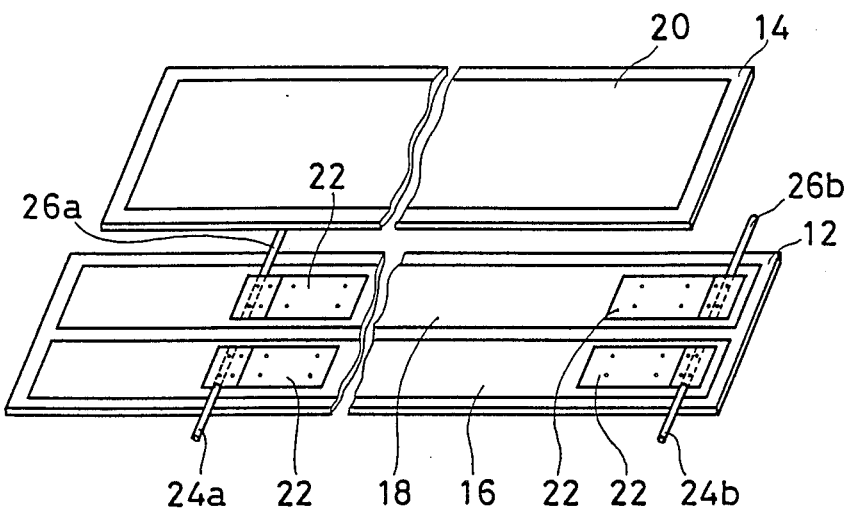
FIG. 11 and FIG. 12 are illustrative views showing another embodiment of a filter in accordance with the present invention.
Figure 12:
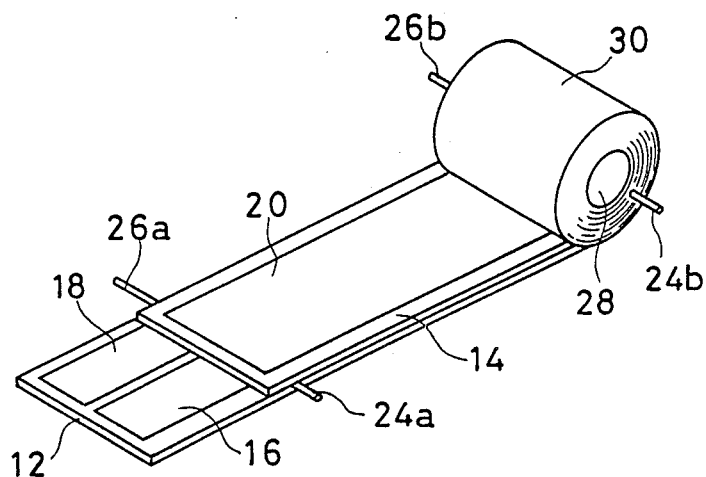

FIG. 11 and FIG. 12 show another embodiment in accordance with the present invention, in which the terminals 24a and 26a of the embodiment shown in FIG. 1 and FIG. 2 are fixed on the conductors 16 and 18 at portions slightly inside the ends in the longitudinal direction of the conductors 16 and 18.

In the embodiment shown in FIG. 11 and FIG. 12, the distance between the terminals 24a and 24b and the distance between the terminals 26a and 26b is shorter than that of the embodiment shown in FIG. 1 and FIG. 2. Therefore, the values of the inductances L1 and L2 are smaller than those in the equivalent circuit shown in FIG. 4. On the other hand, the value of the capacitance C1 has no relation to the distance between the terminals 24a and 24b and the distance between the terminals 26a and 26b, depending rather upon the area where each of the conductors 16 and 18 opposes the conductor 20, etc. Therefore, in this embodiment, it is possible to change the values of the inductance L1 and/or L2 without changing the value of the capacitance C1. Therefore, by properly setting the positions of the terminals 24a and 24b and/or 26a and 26b in a longitudinal direction of the conductors 16 and/or 18, or by arbitrarily setting the value of the capacitance C1 by changing the area where each of the conductors 16 and 18 opposes the conductor 20, that is, the areas of the conductors 16 and 18 themselves, it is possible to easily obtain an optimum filter characteristic.

Figure 13:
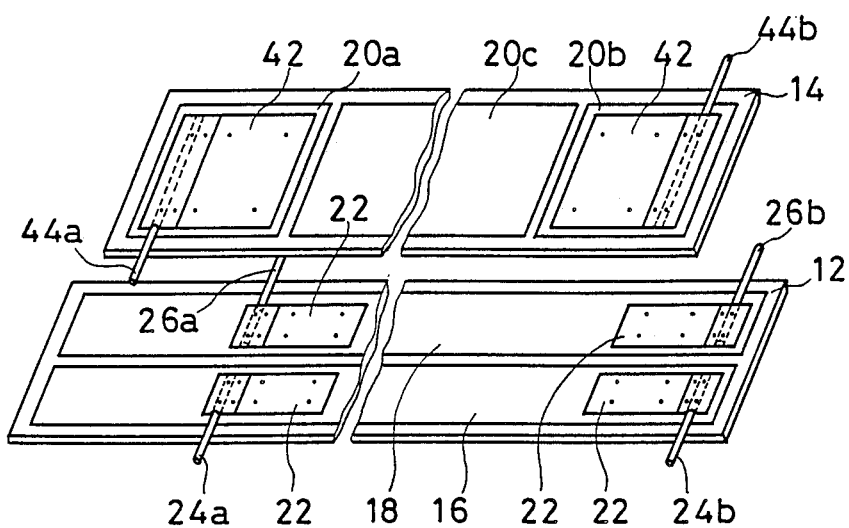
FIG. 13 and FIG. 14 are illustrative views showing still another embodiment of a filter in accordance with the present invention.
Figure 14:
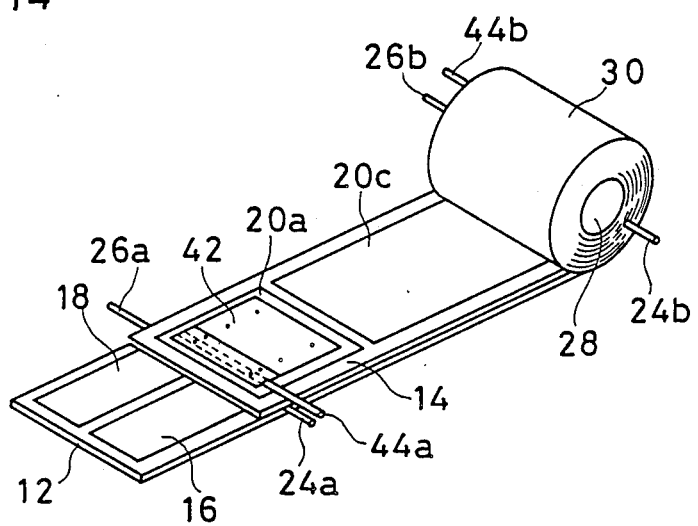

FIG. 13 and FIG. 14 show another embodiment in accordance with the present invention, in which the terminals 24a and 26a of the embodiment as shown in FIG. 6 and FIG. 7 are fixed on the conductors 16 and 18 at positions slightly inside the ends of the conductors 16 and 18 in a longitudinal direction. In this embodiment, as in the embodiment shown in FIG. 11 and FIG. 12, it is possible to arbitrarily set or determine the values of the inductance L1 and/or L2.

However, in this embodiment shown, when the fixing positions of the terminals 24a and 26a are changed to change the inductance values, in order to minimize the residual inductance, the fixing positions of the terminals 44a and 44b are to be preferably adjusted in accordance with such positions, such that each of the terminals 44a and 44b can be positioned at least approximately halfway between the terminals 24a and 24b or between the terminals 26a and 26b in the longitudinal direction.

Although not shown in the embodiments illustrated, the positions of the terminals 24b and 26b may also be changed, such that they are fixed at positions slightly inside the ends of the conductors 16 and 18 in a longitudinal direction.

In addition, although two first conductors 16 and 18 are formed on the film sheet 12 in the above described embodiments, the number of the first conductors may be three or more. In this case, the first conductors between the paired terminals may be connected in series to increase the inductance. In such a case, it is possible to fix one first terminal on one first conductor, and to fix another first terminal, to be paired with one first terminal, on another first conductor, these two first conductors being connected in series.

Furthermore, the shape of the cores employed for increasing the inductance L1 and/or L2 is not limited to being E type as shown in the above described embodiments, but may be I type as well or U type.

In the above described embodiments, conductors are adhered to the film sheets, but such conductors may also be formed on the film sheets by deposition, vacuum evaporation or metal plating. Furthermore, the film sheets may be replaced by paper insulation materials.

In addition, in the above described embodiments, the terminals are extended out of the filter by bending the same downward outside the reinforcing plates; however, the directions in which the terminals are extended and the shapes thereof can be arbitrarily designed, without the limitations illustrated in the disclosed embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A noise filter, comprising:
   a first elongated insulation sheet having a length which defines a longitudinal direction;
   a plurality of first conductors formed on one surface of said first insulation sheet and extended thereon in said longitudinal direction, and spaced apart on said first insulation sheet so as to be insulated from each other;
   a plurality of first terminals fixed on said first conductors in such a manner that at least two pairs of said terminals are fixed on respective different first conductors, end portions of said terminals extending away from said conductors in a width direction of said first insulation sheet;
   a second elongated insulation sheet superposed on said first insulation sheet;
   at least three second conductor elements formed on one surface of said second insulation sheet and extended in a longitudinal direction of said second insulation sheet, said second conductor elements including at least two end elements respectively disposed on said second insulation sheet on both sides of a middle element; and
   at least a pair of second terminals fixed respectively to the end conductor elements at both ends of said second sheet, said middle conductor element having no second terminal fixed thereto; wherein
   said first and second insulation sheets are wound together with said first conductor and second conductor elements so as to form a wound unit such that end portions of said first and second terminals extend from end surfaces of said wound unit;
   inductances are respectively formed between a pair of the first terminals and between another pair of the first terminals by said first conductors;
   a first distributed capacitance is formed between each of said first conductors and said second conductor elements, said distributed capacitance being connected in series between said first conductors via said second conductor elements; and
   a second distributed capacitance is formed between each of said first terminals and said second terminals.
2. A noise filter in accordance with claim 1, further comprising a core inserted into a hollow portion of said wound unit.

* * * * *